(12) United States Patent
Friend et al.

(10) Patent No.: US 8,581,661 B2
(45) Date of Patent: Nov. 12, 2013

(54) AUDIO PROGRAMMABLE GAIN AMPLIFIER WITH AUTOMATIC RECONFIGURATION

(75) Inventors: Brian W. Friend, Carlsbad, CA (US); Christian Larsen, Irvine, CA (US)

(73) Assignee: Conexant Systems, Inc., Irvine, CA (US)

( * ) Notice: Subject to any disclaimer, the term of this patent is extended or adjusted under 35 U.S.C. 154(b) by 0 days.

(21) Appl. No.: 13/280,221

(22) Filed: Oct. 24, 2011

(65) Prior Publication Data

US 2013/0099857 A1    Apr. 25, 2013

(51) Int. Cl.
*H03F 3/45* (2006.01)
(52) U.S. Cl.
USPC .............................. 330/69; 330/254; 330/51
(58) Field of Classification Search
USPC ............................................ 330/69, 51, 254
See application file for complete search history.

(56) References Cited

U.S. PATENT DOCUMENTS

| | | | | |
|---|---|---|---|---|
| 5,764,103 A * | 6/1998 | Burra et al. | | 330/51 |
| 6,271,784 B1 * | 8/2001 | Lynn et al. | | 341/150 |
| 6,313,779 B1 * | 11/2001 | Leung et al. | | 341/155 |
| 7,911,437 B1 * | 3/2011 | Bell | | 345/100 |
| 2011/0068863 A1 * | 3/2011 | Hebert | | 330/75 |

\* cited by examiner

*Primary Examiner* — Patricia T. Nguyen
(74) *Attorney, Agent, or Firm* — Jackson Walker L.L.P.; Christopher J. Rourk

(57) ABSTRACT

A reconfigurable amplifier comprising a first operational amplifier having two inputs and an output. A second operational amplifier having two inputs and an output. A plurality of switches coupled to the two inputs and the output of the first operational amplifier and the two inputs and the output of the second operational amplifier, wherein a first configuration of the plurality of switches causes the first operational amplifier and the second operational amplifier to operate as an inverting differential input amplifier, and wherein a second configuration of the plurality of switches causes the first operational amplifier and the second operational amplifier to operate as a non-inverting differential input instrumentation amplifier.

20 Claims, 4 Drawing Sheets

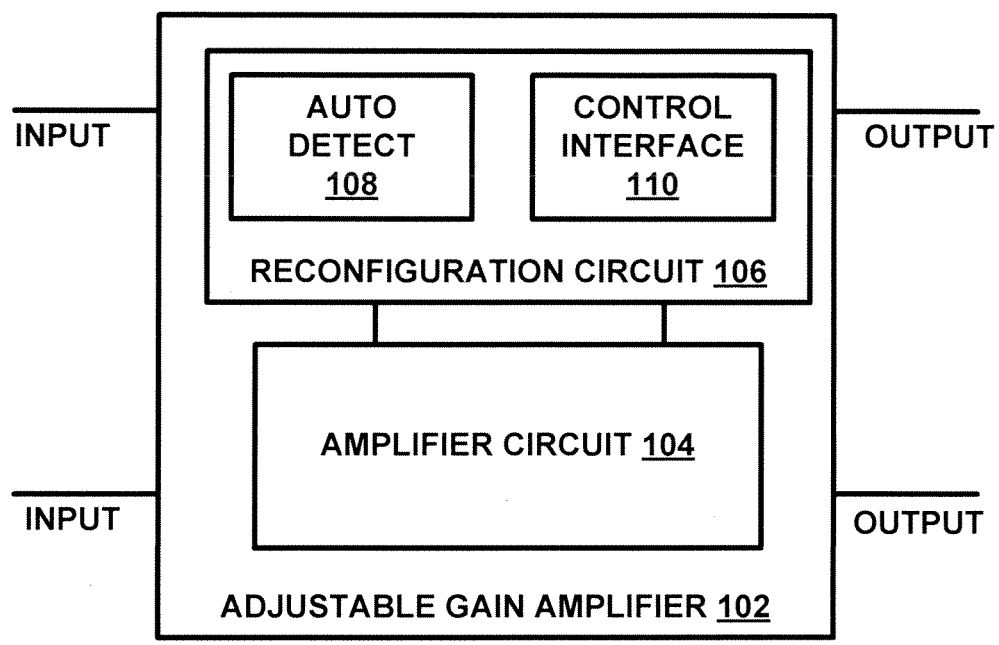

FIG. 2    200 ⇧

AUDIO PROGRAMMABLE GAIN AMPLIFIER WITH AUTOMATIC RECONFIGURATION

TECHNICAL FIELD

The present disclosure pertains to programmable gain amplifiers (PGAs), and more specifically to a PGA with automatic reconfiguration.

BACKGROUND OF THE INVENTION

Audio input receivers (e.g. inputs to audio analog to digital converters or inputs to audio mixers) require a programmable gain amplifier (PGA) to be able to handle a large range of input amplitudes that can be received. Line-input level audio signals (e.g. output from an audio playback device) generally require little or no gain or in some cases require attenuation. Signals from analog microphones need very large amounts of gain (10-40 dB).

There are many challenges associated with such a large gain range. On the one end, input signals require very high linearity. On the other end, large gain is needed for small signals while keeping noise low and input impedance relatively high (analog microphones have relatively high output impedances). No single amplifier configuration can address all of the above challenges without decreasing overall system performance or cost.

SUMMARY OF THE INVENTION

A reconfigurable amplifier is disclosed. The reconfigurable amplifier includes a first operational amplifier having two inputs and an output and a second operational amplifier having two inputs and an output. A plurality of switches is connected to the two inputs and the output of the first operational amplifier and the two inputs and the output of the second operational amplifier, and causes the first operational amplifier and the second operational amplifier to operate as an inverting differential input amplifier in one configuration, and as a non-inverting differential input instrumentation amplifier in another configuration.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE SEVERAL VIEWS OF THE DRAWINGS

Aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views, and in which.

DETAILED DESCRIPTION OF THE INVENTION

Figure 1:
FIG. 1 is a diagram of an amplifier having internally reconfigurable functionality in accordance with an exemplary embodiment of the present disclosure.

In the description that follows, like parts are marked throughout the specification and drawings with the same reference numerals. The drawing figures might not be to scale and certain components can be shown in generalized or schematic form and identified by commercial designations in the interest of clarity and conciseness.

A reconfigurable amplifier is disclosed that automatically reconfigures internal components that are contained within a single integrated circuit structure so as to optimally process high gain signals or low gain signals. In one exemplary embodiment, a reconfigurable amplifier is disclosed with increased input impedance as well as lower noise, that uses a non-inverting configuration at high gain. At lower gains, when the input signal is larger in magnitude, the amplifier automatically reconfigures itself into an inverting structure. There is no cost impact in circuit area or power for the ability to reconfigure, as every component is reused in the different configurations, such as the operational amplifiers, the resistor networks and the filtering capacitors. The switches used for reconfiguration are located so as to avoid any contribution to non-linearity or noise, such as by placing switches that are used to reconfigure the terminals of the operational amplifiers after the pre-amplifier.

FIG. 1 is a diagram of an amplifier 100 having internally reconfigurable functionality in accordance with an exemplary embodiment of the present disclosure. Amplifier 100 can be implemented in hardware or a suitable combination of hardware and software. As used herein, "hardware" can include a combination of discrete components, an integrated circuit, an application-specific integrated circuit, a field programmable gate array, or other suitable hardware. As used herein, "software" can include one or more objects, agents, threads, lines of code, subroutines, separate software applications, two or more lines of code or other suitable software structures operating in two or more software applications or on two or more processors, or other suitable software structures. In one exemplary embodiment, software can include one or more lines of code or other suitable software structures operating in a general purpose software application, such as an operating system, and one or more lines of code or other suitable software structures operating in a specific purpose software application.

Amplifier 100 includes adjustable gain amplifier 102, which includes inputs and outputs. Adjustable gain amplifier 102 includes amplifier circuit 104, which is coupled to reconfiguration circuit 106. In one exemplary embodiment, amplifier circuit 104 includes operational amplifiers and other suitable components, and reconfiguration circuit 106 includes switches, variable resistors, slider switches and other suitable components that are used to reconfigure amplifier circuit 104 so as to alternate between a low gain amplifier, a high gain amplifier, or other suitable amplifier configurations.

Amplifier 100 further includes auto detect 108 and control interface 110. Auto detect 108 detects the impedance of an audio signal source and generates control signals to cause amplifier 100 to reconfigure to a low gain configuration, a high gain configuration or other suitable configurations. Control interface 110 receives an external control signal and reconfigures amplifier 100 to a low gain configuration, a high gain configuration or other suitable configurations as a function of the received control data. In one exemplary embodiment, one of auto detect 108 or control interface 110 can be utilized. In another exemplary embodiment, control interface 108 can override auto detect 108, or auto detect 108 can override control interface 108. Other suitable configurations can also or alternatively be used.

In operation, amplifier 100 automatically reconfigures amplifier circuitry 102 to provide a low gain amplifier, a high gain amplifier or other suitable amplifier configurations using reconfiguration circuit 106. Amplifier 100 can receive an external control signal, can detect an audio source type or can otherwise determine the proper configuration and can automatically reconfigure itself.

Figure 2:
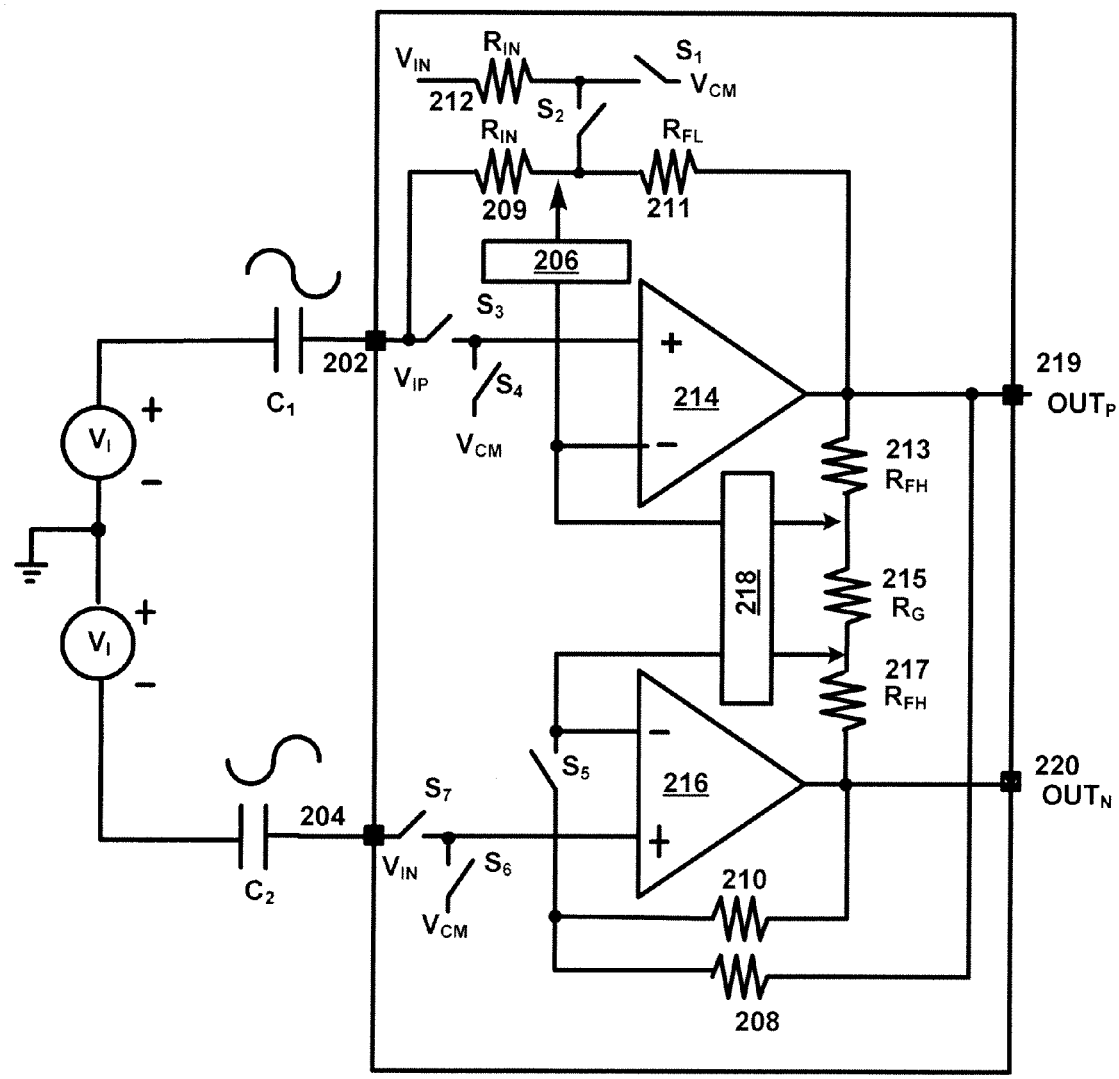
FIG. 2 is a diagram of a system for providing an automatically reconfigurable amplifier having a differential input, in accordance with an exemplary embodiment of the present disclosure.

FIG. 2 is a diagram of a system 200 for providing an automatically reconfigurable amplifier having a differential input, in accordance with an exemplary embodiment of the present disclosure. System 200 can be implemented in hardware or a suitable combination of hardware and software.

System 200 includes input source $V_I$, which drives inputs 202 and 204 through capacitors $C_1$ and $C_2$, switches $S_1$ through $S_7$ (which can be transistors or other suitable switched devices) and slider switches 206 and 218 (which can be a plurality of switch elements coupled to series-connected resistive elements or other suitable devices). In a high gain configuration, switches $S_1$, $S_2$, $S_3$, $S_7$, and one of the switches of slider switch 218 are closed, and switches $S_4$, $S_5$, $S_6$ and one of the switches of slider switch 206 are open. In this configuration, system 200 is configured as a non-inverting instrumentation amplifier. One of the plurality of switch elements of slider switch 218 is closed to select the ratio of feedback resistors $R_{FL}$ 211 and resistor $R_G$ 215 to set the gain. Resistor $R_G$ 215 can be made low resistance to reduce noise, as it is not connected to the analog inputs. Switches S1 and S2 and all of the switch elements of slider switch 206 are configured to set the value of the input resistance at terminals 202 and 204 to $R_{IN}$ 209 and $R_{IN}$ 212. Likewise, in a low gain configuration, switches $S_1$, $S_2$, $S_3$, $S_7$ and slider switch 218 are open, and switches $S_4$, $S_5$, $S_6$ and one of the switch elements of slider switch 206 are closed. In this configuration, system 200 is configured as an inverting amplifier, and the selected switch element of slider switch 206 sets the value of $R_{IN}$ 209 and $R_{FL}$ 211 based on the gain ratio $R_{FL}/R_{IN}$.

More particularly, system 200 includes operational amplifier 214, which has a positive input, a negative input and an output, and operational amplifier 216 which has a positive input, a negative input and an output. Switches $S_1$ through $S_7$ and sliding switches 206 and 218 are connected to the two inputs and the output of operational amplifier 214 and the two inputs and the output of operational amplifier 216, where a first configuration of switches $S_1$ through $S_7$ and sliding switches 206 and 218 causes operational amplifier 214 and operational amplifier 214 to operate as an inverting differential input amplifier, and where a second configuration of switches $S_1$ through $S_7$ and sliding switches 206 and 218 causes first operational amplifier 214 and operational amplifier 218 to operate as a non-inverting differential input instrumentation amplifier.

In one exemplary embodiment, switch $S_3$ has a first terminal connected to positive output terminal 202 of audio source $V_I$ and a second terminal connected to a positive input terminal of operational amplifier 214. Switch $S_4$ has a first terminal connected to voltage common and a second terminal connected to the positive input terminal of operational amplifier 214 and the second terminal of switch $S_3$. Sliding switch 206 has a first terminal connected to a negative input terminal of operational amplifier 214 and a second terminal connected to a first variable resistor comprised of the series combination of $R_{IN}$ 209 and $R_{FL}$ 211. The connection can be made using one of a plurality of switches that are each connected to the series combination of $R_{IN}$ 209 and $R_{FL}$ 211 at a different point, where one of the switches is closed in order to select a resistance value. Switch $S_7$ has a first terminal connected to negative output terminal 204 of audio source $V_I$ and a second terminal connected to a positive input terminal of operational amplifier 216. Switch $S_6$ has a first terminal connected to voltage common and a second terminal connected to the positive input terminal of operational amplifier 216 and the second terminal of switch $S_7$. Switch $S_5$ has a first terminal connected to the negative input of operational amplifier 216 and a second terminal connected to the junction of series connected resistors 210 and 208. Sliding switch 218 has a first terminal connected to a negative input terminal of operational amplifier 216, a second terminal connected to a variable resistor comprised of the series combination of $R_G$ 215 and $R_{FH}$ 213, a third terminal connected to the other end of $R_G$ 215 and another resistor with value of $R_{FH}$ 217 and a fourth terminal connected to sliding switch 206 and the negative input terminal of operational amplifier 214. The second and third terminals of sliding switch 218 can also be selected from a plurality of switches that are coupled to the three resistors ($R_{FH}$ 213, $R_G$ 215 and $R_{FH}$ 217) at different locations, so as to allow the exact value of the resistances to be selectable.

In addition, switch $S_1$ has a first terminal connected to voltage common $V_{CM}$ and a second terminal connected to resistor with a value of $R_{IN}$ 212, which is also connected to the negative terminal 204 of audio source $V_I$. Switch $S_2$ has a first terminal connected to resistor $R_{IN}$ 212 and a second terminal connected to the series combination of $R_{IN}$ 209 and $R_{FL}$ 211. Switch $S_6$ has a first terminal connected to voltage common $V_{CM}$ and a second terminal connected to the positive input to operational amplifier 216. Resistor 210 has a first terminal connected to the negative input to operational amplifier 216 through switch $S_5$ and a second terminal connected to the output of operational amplifier 216. Resistor 208 has a first terminal connected to the negative input to operational amplifier 216 through switch $S_5$ and a second terminal connected to the output of operational amplifier 214. In one exemplary embodiment, resistor 208 and resistor 210 can each be 10K ohms or other suitable values. The series combination of $R_{FL}$ 213, $R_G$ 215 and $R_{FL}$ 217 is connected between the output of operational amplifier 214 and the output of operational amplifier 216.

In operation, system 200 automatically reconfigures switches and slider switch settings to provide an optimal configuration in either a low gain or a high gain configuration. System 200 can be used in combination with a control interface that receives an external control setting, an auto detect system that detects the type of source that is connected to system 200, or other suitable systems to allow the internal circuit configuration to be adapted to the audio source.

Figure 3:
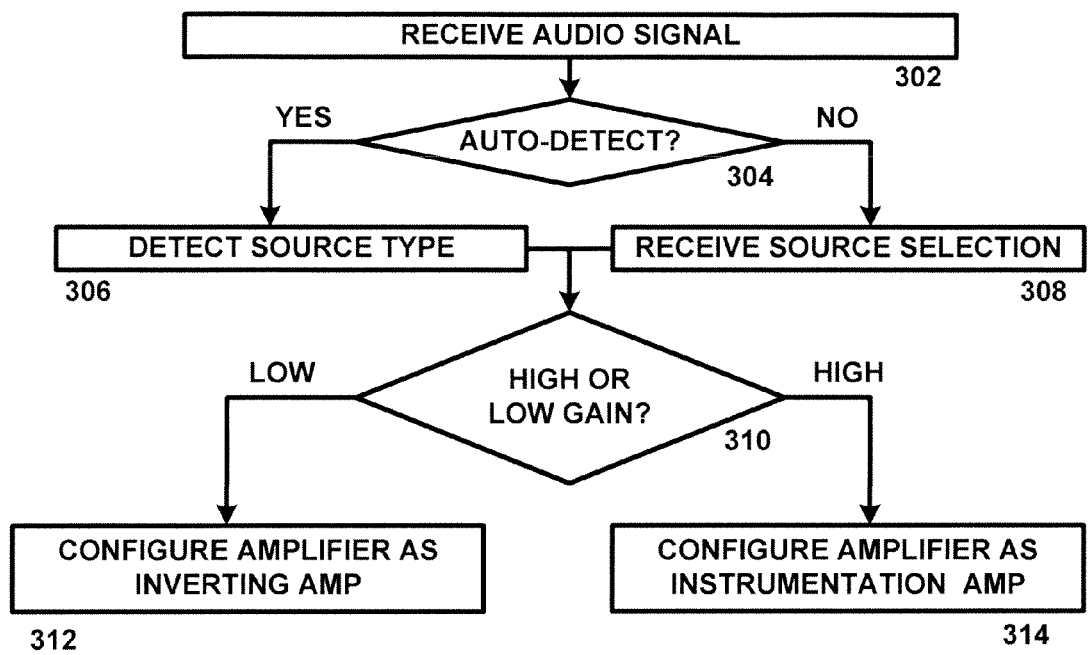
FIG. 3 is a diagram of an algorithm for automatically reconfiguring a configurable amplifier in accordance with an exemplary embodiment of the present disclosure.

FIG. 3 is a diagram of an algorithm 300 for automatically reconfiguring a configurable amplifier in accordance with an exemplary embodiment of the present disclosure. Algorithm 300 can be implemented in hardware, such as using a field programmable gate array or integrated logic devices, or a suitable combination of hardware and software.

Algorithm 300 begins at 302 where an audio signal is received. In one exemplary embodiment, the audio signal can be received at an input of an integrated circuit or in other suitable manners. The algorithm then proceeds to 304 where it is determined whether the source type of the audio signal can be automatically detected. In one exemplary embodiment, the impedance of the source type can be used to determine whether the source is a high impedance source such as an analog microphone or a low impedance source, such as a signal from an audio playback device. In another exemplary embodiment, control data indicating source type can be received, port configuration data can be detected that identifies whether an input is being received from a first port associated with a high impedance source or a second port associated with a low impedance port, or other suitable data can be received or detected. If it is determined that auto-detection is available, the algorithm then proceeds to 306, otherwise the algorithm proceeds to 308.

At 306, the source type is detected. In one exemplary embodiment, a selection between a high gain source and a low gain source is made, such as by detecting a source impedance or in other suitable manners. In another exemplary embodiment, gain data is received, such as from a gain control or other suitable sources. The algorithm then proceeds to 310.

At 308, source selection data is received. In one exemplary embodiment, data generated by an input selection switch or other suitable data can be received and used to determine whether a source is a high gain source or a low gain source, the gain value associated with the source or other suitable data. The algorithm then proceeds to 310.

At 310, it is determined whether a high gain configuration or a low gain configuration is required. In one exemplary embodiment, the detected source type or source selection can include a high or low gain configuration identifier. In another exemplary embodiment, a specific gain value can be used to determine whether a high gain configuration or a low gain configuration is needed, or other suitable configurations can be used. If it is determined that a low gain configuration is needed, the algorithm proceeds to 312 where the reconfigurable amplifier is configured as an inverting amplifier. In one exemplary embodiment, a plurality of switches can be used to configure the connections between resistors and the terminals of operational amplifiers into an inverting amplifier configuration.

If it is determined at 310 that a high gain configuration is needed, the algorithm proceeds to 312 where the reconfigurable amplifier is configured as an instrument amplifier. In one exemplary embodiment, a plurality of switches can be used to configure the connections between resistors and the terminals of operational amplifiers into an instrument amplifier configuration.

Figure 4:
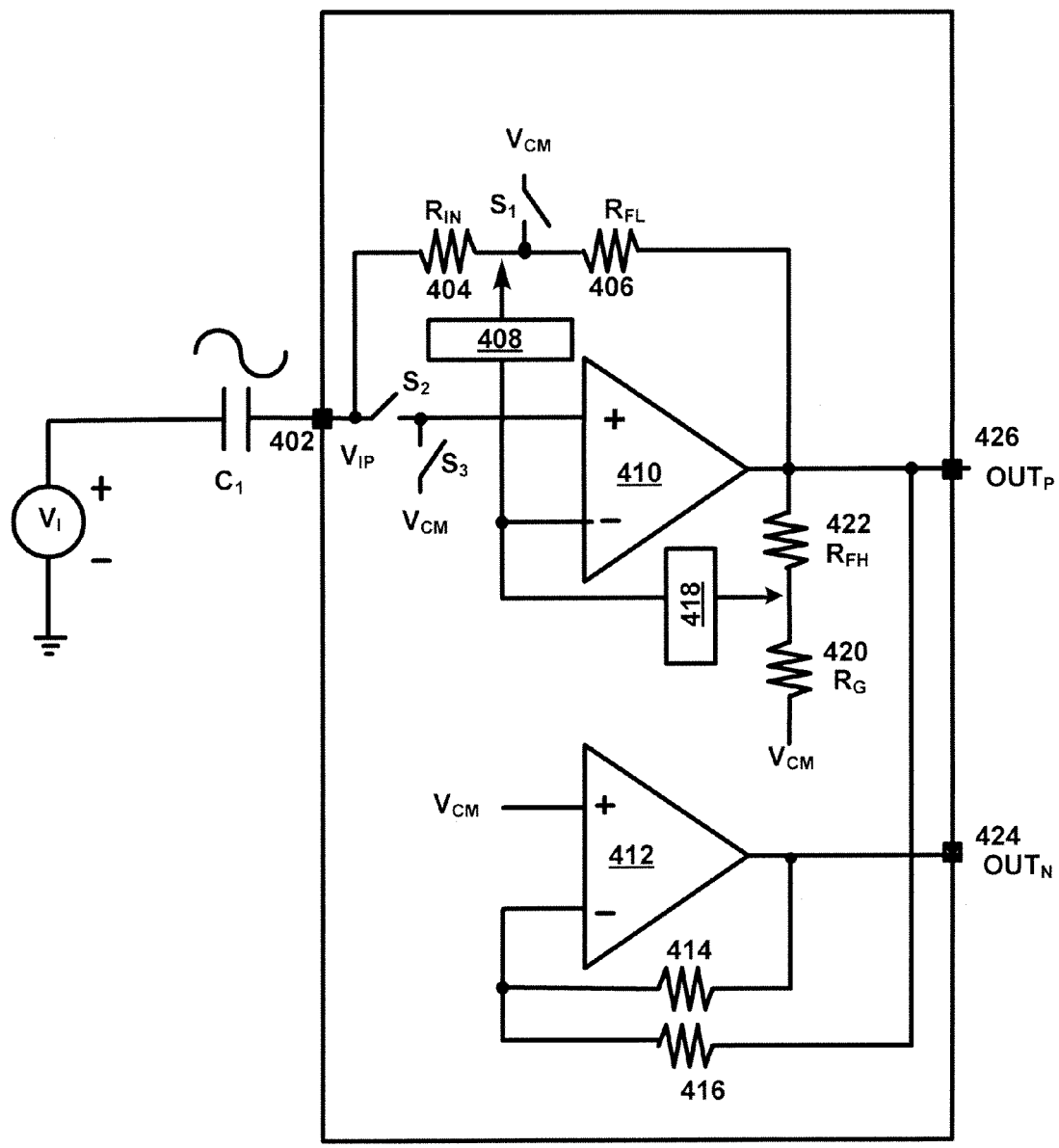
FIG. 4 is a diagram of a system for providing an automatically reconfigurable amplifier having a single input, in accordance with an exemplary embodiment of the present disclosure.

FIG. 4 is a diagram of a system 400 for providing an automatically reconfigurable amplifier having a single input, in accordance with an exemplary embodiment of the present disclosure. System 400 is similar to system 200, but excludes a number of switches and resistors. In system 400, switches $S_1$ and $S_2$ and slider switch 418 are open for low gain and are closed for high gain, and switch $S_3$ and slider switch 408 are open for high gain and closed for low gain. Switch $S_1$ is connected to $V_{CM}$ and $R_{IN}$ 404 and $R_{FL}$ 406, as shown. Switch $S_2$ is connected to signal input 402 and the positive voltage input to operational amplifier 410. Switch $S_3$ is connected to $V_{CM}$ and the positive voltage input to operational amplifier 410. Slider switch 408 is connected to $R_{IN}$ 404 and $R_{FL}$ 406, as shown, and slider switch 418 is connected to $R_{FH}$ 422 and $R_G$ 420, as shown.

In operation, system 400 automatically reconfigures switches and slider switch settings to provide an optimal configuration in either a low gain or a high gain configuration. System 200 can be used in combination with a control interface that receives an external control setting, an auto detect system that detects the type of source that is connected to system 400, or other suitable systems to allow the internal circuit configuration to be adapted to the audio source.

It should be emphasized that the above-described embodiments are merely examples of possible implementations. Many variations and modifications may be made to the above-described embodiments without departing from the principles of the present disclosure. All such modifications and variations are intended to be included herein within the scope of this disclosure and protected by the following claims.

What is claimed is:

1. A reconfigurable amplifier comprising:
    a first operational amplifier having two inputs and an output;
    a second operational amplifier having two inputs and an output; and
    a plurality of switches coupled to the two inputs and the output of the first operational amplifier and the two inputs and the output of the second operational amplifier, wherein a first configuration of the plurality of switches causes the first operational amplifier and the second operational amplifier to operate as an inverting differential input amplifier, and wherein a second configuration of the plurality of switches causes the first operational amplifier and the second operational amplifier to operate as a non-inverting differential input instrumentation amplifier, and further comprising a first switch having 1) a first terminal coupled to a negative output terminal of an audio source and 2) a second terminal coupled to a positive input terminal of the second operational amplifier.

2. The reconfigurable amplifier of claim 1 wherein the plurality of switches further comprises a second switch having 1) a first terminal coupled to a positive output terminal of an audio source and 2) a second terminal coupled to a positive input terminal of the first operational amplifier.

3. The reconfigurable amplifier of claim 2 wherein the plurality of switches comprises a third switch having 1) a first terminal coupled to voltage common and 2) a second terminal coupled to the positive input terminal of the first operational amplifier and the second terminal of the first switch.

4. The reconfigurable amplifier of claim 1 wherein the plurality of switches comprises a slider switch having 1) a first terminal coupled to a negative input terminal of the first operational amplifier and 2) a second terminal coupled to a variable resistor.

5. The reconfigurable amplifier of claim 1 wherein the plurality of switches comprises a second switch having 1) a first terminal coupled to voltage common and 2) a second terminal coupled to the positive input terminal of the second operational amplifier and the second terminal of the first switch.

6. The reconfigurable amplifier of claim 3 wherein the plurality of switches further comprises a slider switch having 1) a first terminal coupled to a negative input terminal of the second operational amplifier and 2) a second terminal coupled to a variable resistor.

7. The reconfigurable amplifier of claim 1 wherein the plurality of switches comprises:
    a second switch having 1) a first terminal coupled to a positive output terminal of an audio source and 2) a second terminal coupled to a positive input terminal of the first operational amplifier;
    a third switch having 1) a first terminal coupled to voltage common and 2) a second terminal coupled to the positive input terminal of the first operational amplifier and the second terminal of the second switch;

a first slider switch element having 1) a first terminal coupled to a negative input terminal of the first operational amplifier and 2) a second terminal coupled to a first variable resistor;

a fourth switch having 1) a first terminal coupled to voltage common and 2) a second terminal coupled to the positive input terminal of the second operational amplifier and the second terminal of the first switch; and a second slider switch element having a first terminal coupled to a negative input terminal of the second operational amplifier.

8. A reconfigurable amplifier comprising:
a first input and a second input;
a first output and a second output;
an amplifier circuit;
a reconfiguration circuit coupled to the amplifier circuit and further comprising:
    a first switch having 1) a first terminal coupled to a positive output terminal of an audio source and 2) a second terminal coupled to a positive input terminal of an operational amplifier;
    a second switch having 1) a first terminal coupled to voltage common and 2) a second terminal coupled to the positive input terminal of the operational amplifier and the second terminal of the first switch; and
    a first slider switch having 1) a first terminal coupled to a negative input terminal of the operational amplifier and 2) a second terminal coupled to a variable resistor; and
wherein the reconfiguration circuit is configured to cause the amplifier circuit to operate as a low gain amplifier in a first configuration and to operate as a high gain amplifier in a second configuration.

9. The reconfigurable amplifier of claim 8 wherein the reconfiguration circuit comprises a third switch having 1) a first terminal coupled to a negative output terminal of an audio source and 2) a second terminal coupled to a positive input terminal of a second operational amplifier.

10. The reconfigurable amplifier of claim 9 wherein the reconfiguration circuit comprises a fourth switch having 1) a first terminal coupled to voltage common and 2) a second terminal coupled to the negative input terminal of the second operational amplifier and the second terminal of the first switch.

11. The reconfigurable amplifier of claim 10 wherein the plurality of switches comprises a second slider switch.

12. The reconfigurable amplifier of claim 8 further comprising a control interface system for receiving a data field that defines whether an audio source requires a high gain amplifier or a low gain amplifier and for changing a configuration of the reconfigurable amplifier.

13. The reconfigurable amplifier of claim 8 further comprising an auto detect system for automatically detecting whether an audio source requires a high gain amplifier or a low gain amplifier.

14. A method for operating a reconfigurable amplifier comprising:
receiving a reconfiguration signal;
applying a first signal to open a first plurality of switches coupled to a plurality of operational amplifiers; and
applying a second signal to close the first plurality of switches coupled to the plurality of operational amplifiers;
wherein the plurality of operational amplifiers is configured to operate as a low gain amplifier when the first plurality of switches is opened, and to operate as a high gain amplifier when the first plurality of switches is closed, and wherein the first plurality of switches includes a first switch having 1) a first terminal coupled to a negative output terminal of an audio source and 2) a second terminal coupled to a positive input terminal of a first operational amplifier and a second switch having 1) a first terminal coupled to a positive output terminal of an audio source and 2) a second terminal coupled to a positive input terminal of a second operational amplifier.

15. The method of claim 14 wherein applying the first signal and the second signal causes the first plurality of switches and a second plurality of switches to configure the plurality of operational amplifiers as an inverting differential input amplifier.

16. The method of claim 14 wherein closing the first plurality of switches and opening a second plurality of switches configures the plurality of operational amplifiers as a non-inverting differential input instrumentation amplifier.

17. The reconfigurable amplifier of claim 1 wherein the plurality of switches comprises:
    a second switch having 1) a first terminal coupled to a positive output terminal of the audio source and 2) a second terminal coupled to a positive input terminal of the first operational amplifier;
    a third switch having 1) a first terminal coupled to voltage common and 2) a second terminal coupled to the positive input terminal of the first operational amplifier and the second terminal of the second switch; and
    a slider switch having 1) a first terminal coupled to a negative input terminal of the first operational amplifier and 2) a second terminal coupled to a first variable resistor.

18. The reconfigurable amplifier of claim 1 wherein the plurality of switches comprises:
    a second switch having 1) a first terminal coupled to a positive output terminal of the audio source and 2) a second terminal coupled to a positive input terminal of the first operational amplifier;
    a third switch having 1) a first terminal coupled to voltage common and 2) a second terminal coupled to the positive input terminal of the first operational amplifier and the second terminal of the second switch; and
    a fourth switch having 1) a first terminal coupled to voltage common and 2) a second terminal coupled to the positive input terminal of the second operational amplifier and the second terminal of the first switch.

19. The reconfigurable amplifier of claim 1 wherein the plurality of switches comprises:
    a second switch having 1) a first terminal coupled to a positive output terminal of the audio source and 2) a second terminal coupled to a positive input terminal of the first operational amplifier;
    a third switch having 1) a first terminal coupled to voltage common and 2) a second terminal coupled to the positive input terminal of the first operational amplifier and the second terminal of the second switch;
    a first slider switch having 1) a first terminal coupled to a negative input terminal of the first operational amplifier and 2) a second terminal coupled to a first variable resistor; and
    a second slider switch.

20. The reconfigurable amplifier of claim 1 wherein the plurality of switches comprises:
    a second switch having 1) a first terminal coupled to a positive output terminal of the audio source and 2) a second terminal coupled to a positive input terminal of the first operational amplifier;

a third switch having 1) a first terminal coupled to voltage common and 2) a second terminal coupled to the positive input terminal of the first operational amplifier and the second terminal of the second switch;
a fourth switch having 1) a first terminal coupled to voltage common and 2) a second terminal coupled to the positive input terminal of the second operational amplifier and the second terminal of the first switch; and
a first slider switch.

* * * * *